United States Patent [19]

Hirata et al.

[11] Patent Number: 4,460,413

[45] Date of Patent: Jul. 17, 1984

[54] METHOD OF PATTERNING DEVICE REGIONS BY OXIDIZING PATTERNED ALUMINUM LAYER

[75] Inventors: Kazuo Hirata; Masatoshi Oda, both of Tokyo, Japan

[73] Assignee: Nippon Telegraph & Telephone Public Corp., Tokyo, Japan

[21] Appl. No.: 331,612

[22] Filed: Dec. 17, 1981

[30] Foreign Application Priority Data

Dec. 26, 1980 [JP] Japan ............................... 55-189024
Apr. 30, 1981 [JP] Japan ................................. 56-65491

[51] Int. Cl.³ .................. H01L 21/76; H01L 21/225; H01L 29/78; H01L 21/308
[52] U.S. Cl. ................................ 148/1.5; 29/576 W; 148/187; 156/628; 156/667; 427/85
[58] Field of Search ................. 148/1.5, 187; 156/643, 156/653, 628, 667; 427/85, 86; 29/576 W

[56] References Cited

U.S. PATENT DOCUMENTS

| | | | |
|---|---|---|---|
| 3,634,203 | 11/1972 | McMohan | 204/15 |
| 3,690,966 | 9/1972 | Hayashi et al. | 148/187 |
| 3,976,512 | 8/1976 | De Nora et al. | 148/1.5 |
| 4,035,206 | 7/1977 | Rioult et al. | 156/628 |
| 4,124,933 | 11/1978 | Nicholas | 29/578 |
| 4,209,350 | 6/1980 | Ho et al. | 148/188 |
| 4,256,514 | 3/1981 | Pogge | 148/1.5 |
| 4,312,680 | 1/1982 | Hsu | 148/1.5 |
| 4,358,340 | 11/1982 | Fu | 29/571 |

FOREIGN PATENT DOCUMENTS 153343 11/1980 Japan ................................. 156/628

OTHER PUBLICATIONS

Anantha et al. IBM-TDB, 22 (1980) 4895.
Abbas et al. IBM-TDB, 20 (1977) 1376.
High Density, Planar Metal Lands, by R. J. Miller, IBM Technical Disclosure Bulletin, vol. 23, No. 6, Nov. 1980, pp. 2270 through 2276.
Crystallographic Orientation of Silicon or an Amorphous Substrate Using an Artificial Surface-Relief Grating and Laser Crystallization, by M. G. Geis et al., Appl. Phys. Lett., 35(1), Jul. 1, 1979, pp. 71–74.
Silicon Grapho-Epitaxy Using a Strip-Heater Oven, by M. W. Geis et al., Appl. Phys. Lett., 37(5), Sep. 1, 1980, pp. 454 to 456.
Grapho-Epitaxy of Silicon on Fused Silica Using Surface Micro Patterns and Laser Crystallization by M. W. Geis et al., J. Vac. Sci. Technol., 16(6), Nov./Dec. 1979.
Plasma Anodized Aluminum Oxide Films by George J. Tibol et al., Journal of The Electro-Chemical Society, Dec., 1964, pp. 1368–1372.
The Use of Silane Silicon Dioxide Films to Contour Oxide Edges by Lou H. Hall et al., Thin Solid Films, 9 (1972), pp. 447–455.
Improved Reliability of Electron Devices Through Optimized Coverage of Surface Topography, by Weruner Kern et al., 11th Annual Proceedings Reliability Physics, 1973, pp. 214–223.

*Primary Examiner*—Upendra Roy
*Attorney, Agent, or Firm*—Thompson, Birch, Gauthier & Samuels

[57] ABSTRACT

A pattern utilized to prepare a diffraction grating, or an element of a semiconductor device, for example a silicon island, or a device isolation pattern or a semiconductor element, such as a MOS FET, is formed by the steps of forming an oxidizable region of a predetermined pattern on a substrate and oxidizing the oxidizable region for forming an oxide region pattern in at least a portion of the sidewalls of the oxidizable region. The resulting pattern, which is extremely fine and formed at a low cost, has a sufficiently large height with respect to its width. Furthermore the pattern can be formed at a relatively low temperature.

10 Claims, 37 Drawing Figures

METHOD OF PATTERNING DEVICE REGIONS BY OXIDIZING PATTERNED ALUMINUM LAYER

BACKGROUND OF THE INVENTION

This invention relates to a method of forming a pattern, and more particularly, is directed towards a method of forming an extremely fine pattern.

A typical prior method of forming patterns is a lithographic method utilizing various beam sources. According to this method, a resist layer coated on a substrate is selectively subjected to working beams or rays of light, such as electrons and X rays, and the portion subjected or not subjected to such working beam or rays is removed by development to obtain a desired pattern. According to this method, however, the accuracy of the resulting pattern is determined by the accuracy of exposing the resist layer to the working beam, so that the lithographic apparatus is required to have a complicated construction and a high degree of accuracy, thereby increasing the cost of the apparatus.

With the recent development of a large scale integrated circuit technique (LSI), it is necessary to work an extremely small pattern with a high degree of accuracy. For example, in recent years, workings of submicron accuracy are desired, and when one tries to have such fine workings with a prior art method, the apparatus becomes extremely complicated and expensive.

In the manufacture of an extremely fine pattern with the prior art method, it is necessary to make the resist film adapted to form a pattern thin so that the diffraction of light or dispersion of an electron beam in the resist layer is small. In consequence, the height of the resulting pattern is not sufficient with respect to the width of the pattern. Where such pattern is used as an etching mask, the utility of subsequent working is limited.

In the manufacture of the LSI described above, many high temperature treatments, such as heat diffusion, are necessary in many cases. Since such high temperature treatments do not always give favorable effects on the device characteristics, it is desirable to decrease, as far as possible, the number of such high temperature treatments.

One example of a method of preparing a fine pattern without utilizing lithography is disclosed in U.S. Pat. No. 4,124,933, for example. According to this method, boron is doped by heat diffusion into the sidewalls of a polycrystalline silicon pattern, and only the doped region is left on the substrate by utilizing the difference in the etching rates of the doped region and of the not doped region, thereby forming a fine pattern. This method, however, requires a high temperature treatment such as heat diffusion. Such high temperature treatment is not always suitable for the manufacturing of LSIs and other high density devices. High temperature treatments not only limits the material used in the device fabrication, but also degrades the characteristics of the devices. For this reason it is desirable to provide a method that can prepare a fine pattern at a relatively low temperature.

SUMMARY OF THE INVENTION

Accordingly, it is the principal object of this invention to provide a method of forming a fine pattern that can be readily manufactured at a low cost.

Another object of this invention is to provide a method of forming a pattern which is much finer than that formed by a prior art method that is of the order of 0.5 to 0.01 micron.

Still another object of this invention is to provide a method of forming a pattern having a sufficiently large height with respect to its width.

Still another object of this invention is to provide a method of forming a pattern at a relatively low temperature which is utilized to prepare a semiconductor device.

According to this invention there is provided a method of forming a pattern comprising the steps of forming an oxidizable region of a predetermined pattern on a substrate, and oxidizing the oxidizable region for forming an oxide region pattern in at least a portion of the sidewalls of the oxidizable region. The oxide region pattern is used to prepare a diffraction grating, or an element of a semiconductor device, for example a silicon island, or a device isolation pattern or a semiconductor device such as a MOS FET.

DESCRIPTION OF THE PREFERRED EMBODIMENTS

Figure 1A:
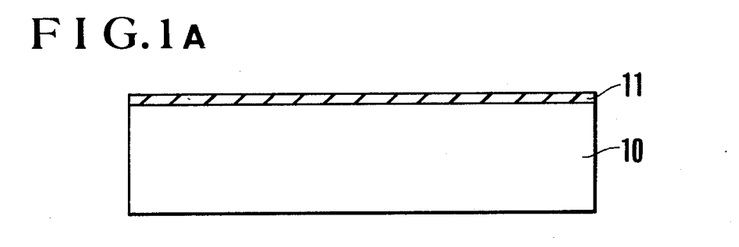
FIGS. 1A through 1I show successive steps of an embodiment of the method of this invention.

In a preferred embodiment of this invention shown in FIGS. 1A through 1I, at first a (100) silicon substrate 10 having a thickness of about 400 microns, for example, is prepared. Then, the substrate is heated in an oxygen ($O_2$) atmosphere at a temperature of 1050° C. for 80 minutes to form an insulating layer 11 of a silicon dioxide film $SiO_2$ having a thickness of about 1000 angstroms. This state is shown in FIG. 1A.

Figure 1B:
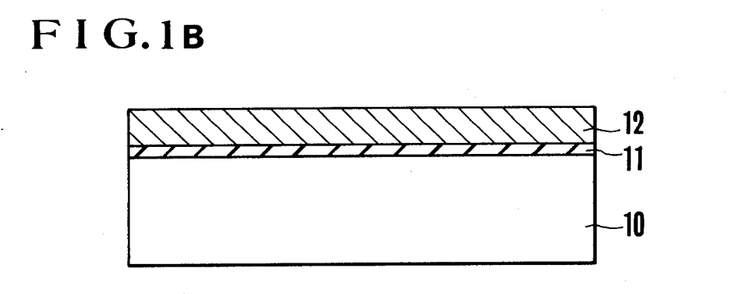

Then, an oxidizable material, aluminum for example, is vacuum deposited on the oxide layer 11 to a thickness of several thousand angstroms, preferably about 5000 angstroms at an evaporation rate of 22 angstroms/sec., and for about 4 minutes, thereby forming an oxidizable layer 12. This state is shown in FIG. 1B.

Figure 1C:
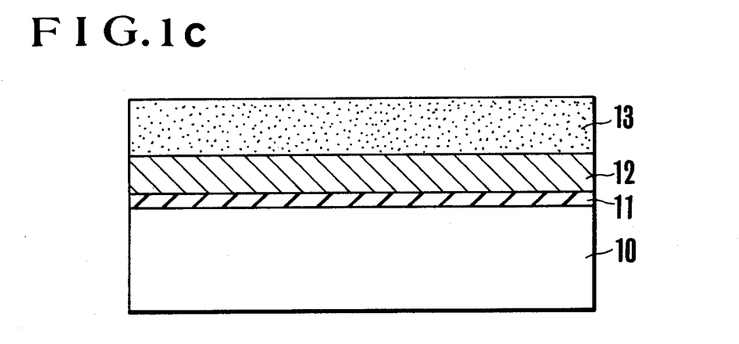

Then, a positive photoresist, for example AZ 1350, (trade name of Shipley Co., Inc.) is coated on the oxidizable layer 12 to a thickness of 5000 angstroms by a spin coating method. Then, the assembly is prebaked in an $N_2$ atmosphere at a temperature of 90° C. for 30 minutes to form a photoresist layer 13. This state is shown in FIG. 1C.

Figure 1D:
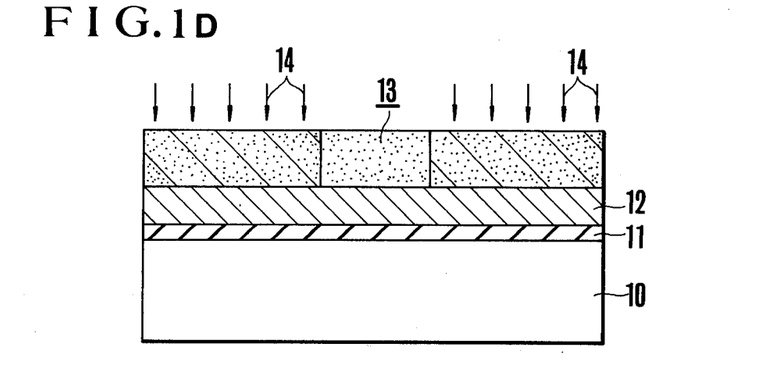
Figure 1E:
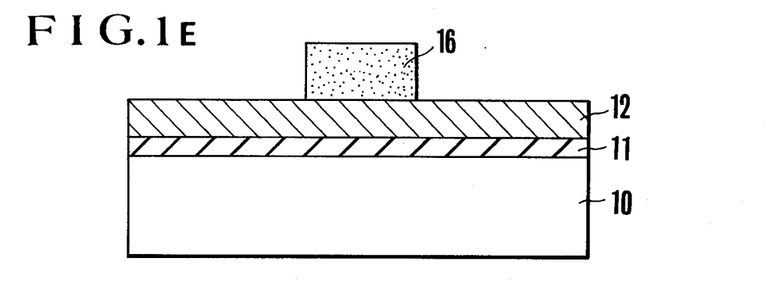

Then, as shown in FIG. 1D, the photoresist layer 13 is exposed to light 14, for example ultra violet rays, by using a predetermined pattern. Light exposure may be made with contact printing or projection printing techniques or any other well known exposure method. Subsequent to the light exposure, the assembly is developed to remove portions of the photoresist layer 13 exposed to light and then subjected to post baking in $N_2$ atmosphere at a temperature of 120° C. for 20 minutes, thereby forming a photoresist region 16 shown in an FIG. 1E. As will be described later, this region 16 is used as a mask for the oxidizable layer 12.

Figure 1F:
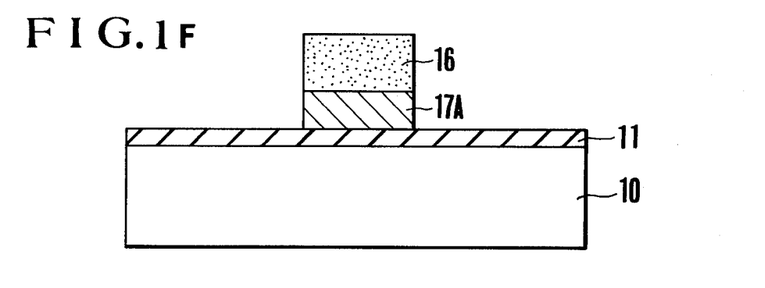

More particularly, region 16 is used as a mask for a parallel plate plasma etching treatment which is performed in a gas plasma of $CCl_4$ at a pressure of 0.25 Torr. In this case, current of 3A having a frequency of 380 KHz, for example is used. As a result of this plasma etching, the portion of the oxidizable layer 12 exposed to the plasma is removed so that only the portion of the oxidizable region 17A underlying the photoresist region 16 remains together with the photoresist region 16. This state is shown in FIG. 1F. At this time, the sidewalls of the oxidizable region 17A are formed vertically.

Figure 1G:
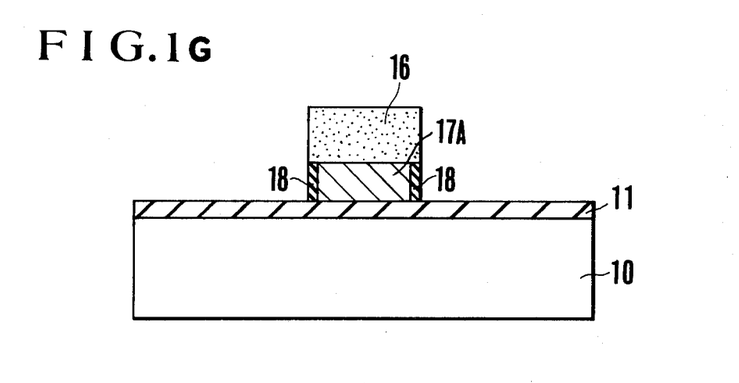

Then, the oxidizable region 17A is oxidized to oxidize the exposed sidewalls thereof to form an oxidized region 18 surrounding the region 17A as shown in FIG. 1G. The oxidization may be made using the Bomite method or the plasma oxidation method. The Bomite method will be described hereunder by using aluminum as an oxidizable material. The assembly described above is immersed in warm water at a temperature of 60° C. for 25 minutes to form an oxide layer 18 having a thickness of about 0.2 micron in the sidewalls of the region 17A.

Figure 2:
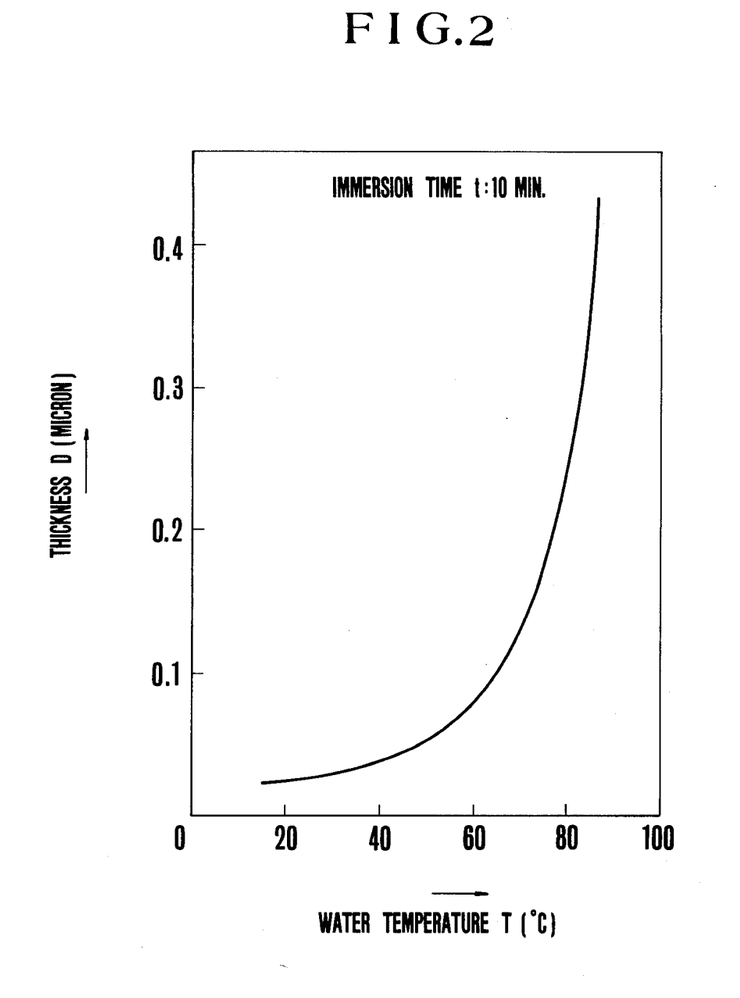
FIG. 2 is a characteristic curve showing the relation between a variation in the thickness of an oxide region formed by the oxidation treatment carried out in the step shown in FIG. 1G and the water temperature.
Figure 3:
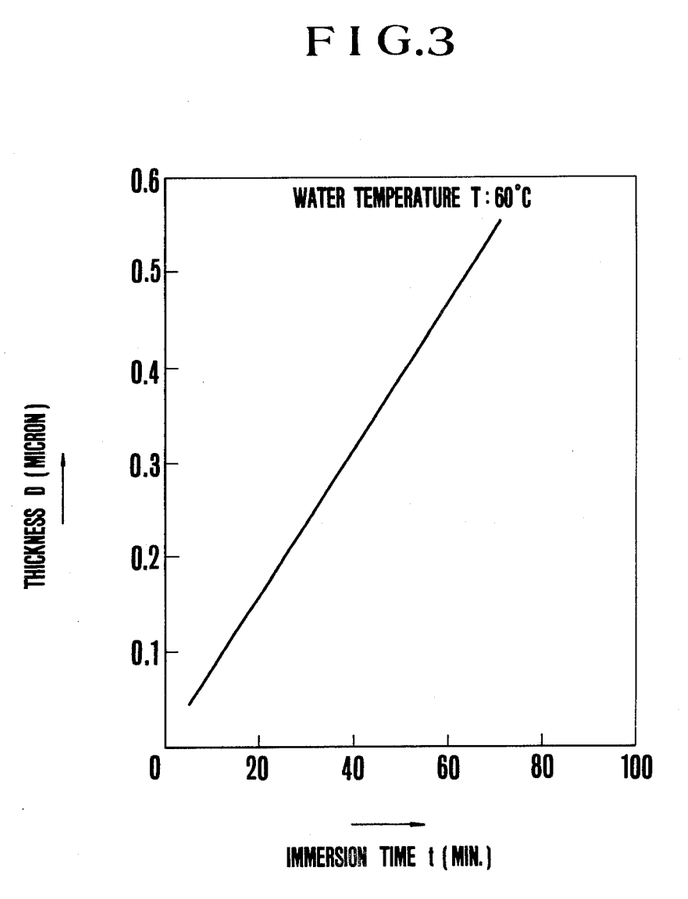
FIG. 3 shows the relation between the immersion time in minutes of an oxide region and the variation in the thickness.

More particularly, when aluminum is immersed in the warm water for 10 minutes the relation between the temperature of the water and the thickness D of the oxide layer is shown in FIG. 2. When the water temperature T is 60° C., the relation between the immersion time and the thickness D of the oxide layer is shown in FIG. 3. These characteristics show that the thickness D of the oxide layer to be formed can be determined by suitably selecting the water temperature and the immersion time.

Figure 1H:
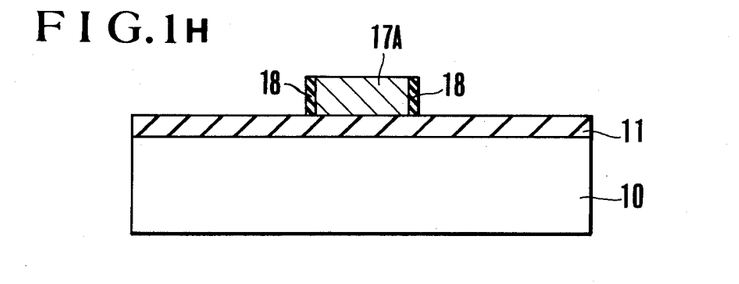
Figure 1I:
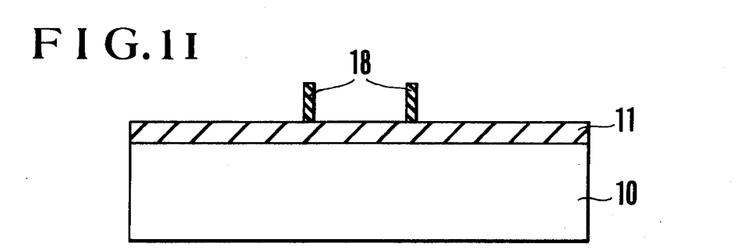

When plasma oxidization is used, the oxide layer 18 can be formed according to a method disclosed in a George J. Tibol et al paper entitled "Plasma Anodized Aluminum Oxide Films", Journal of the Electrochemical Society, December, 1964, PP 1368-1372. Then, the resist region 16 is removed in oxygen plasma at a pressure of 1 Torr by barrel type plasma reactor in which a high frequency power of about 200 W and 13.56 MHz is supplied. Alternatively, the parallel plate plasma etching technique described in connection with FIG. 1 may be used. The state after removal of the resist region is shown in FIG. 1H. Thereafter, the oxidizable region 17A is removed with a parallel plate plasma etching technique utilizing $CCl_4$ in the same manner as in FIG. 1F to obtain an oxide region 18 having a predetermined pattern as shown in FIG. 1I.

According to the method described above, the thickness or width of the resulting oxide region 18 can be determined by the parameters utilized to oxidize the oxidizable layer. Accordingly, unlike prior art methods, the present invention teaches that the width of the resulting pattern is not influenced by the accuracy of the mask and moreover, the pattern can be readily formed by merely oxidizing the oxidizable layer. Furthermore, the process step for obtaining the oxide region is relatively simple and does not require a high working accuracy as in the prior art method. Thus, according to the method of this invention, it is possible to readily obtain a desired pattern at a low cost. Moreover, it is possible to accurately make the width of the pattern to be less than 1 micron, that is of the order of submicron which was difficult to obtain by any prior art method. The height of the pattern is determined by the thickness of the oxidizable layer 17 firstly formed on the substrate. In this example, the pattern has a height of 0.5 micron and a width of 0.2 micron which are much smaller than the pattern prepared by the prior art method.

Although in the foregoing embodiment, AZ1350 was used as the resist material, polymethyl methacrylate may also be used, in which case a mixture of methyl isobutyl ketone and isopropyl alcohol is used as a developing solution. When polymethyl methacrylate is used, electron beam lithography is used instead of photolithography. Since the electron beam lithography is well known in that art, its detail will not be described herein.

The pattern thus obtained can be used as a mask for preparing a grating requiring a fine pattern, a device isolation region, or a gate electrode of a silicon gate MOS FET. Further, it is possible to leave the fine pattern composed of an oxide as is and use the pattern as a diffraction grating.

Figure 4A:
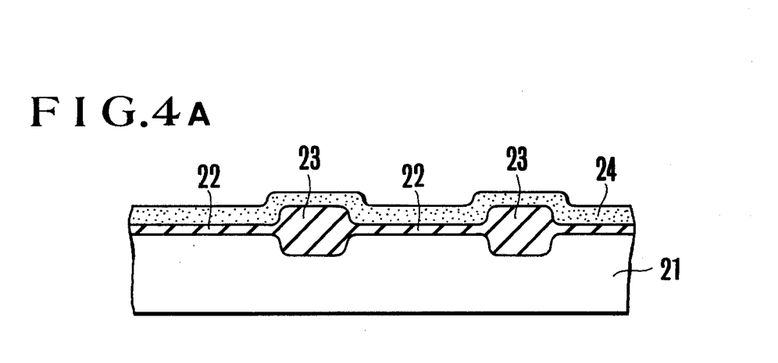
FIGS. 4A through 4F show one example of successive steps of preparing a short channel MOS FET (field effect transistor) according to the method of forming a pattern of this invention.
Figure 4B:
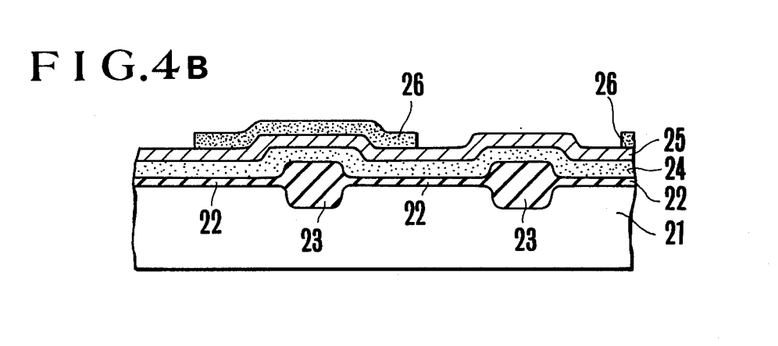

FIGS. 4A through FIG. 4F show a modification of the method of this invention. As shown in FIG. 4A, on a P type silicon substrate 21 are formed a gate oxide film 22 and a thick oxide region 23 for isolation, and a polycrystalline layer 24 is formed thereon. This construction can be readily obtained by a well known method. Then, as shown in FIG. 4B, an aluminum layer 25, one of the oxidizable materials, is vapor-deposited on the polycrystalline silicon layer 24, and a predetermined photoresist pattern 26 is formed on the aluminum layer 25.

Figure 4C:
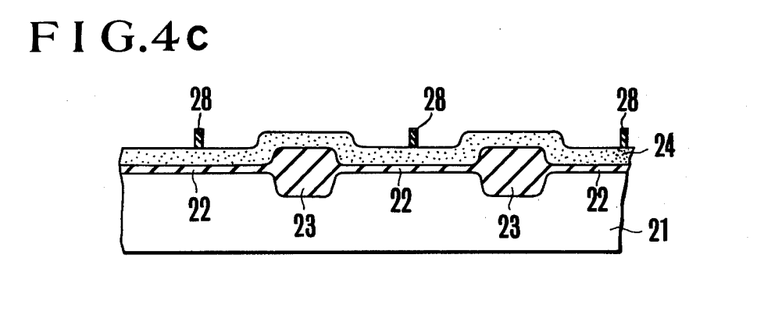

Then, as shown in FIG. 4C, the aluminum layer 25 is etched off by using the photoresist pattern 26 as a mask according to the method described in connection with the preceding embodiment, and the remaining aluminum layer is oxidized. Then, the photoresist pattern 26, the remaining aluminum layer 25 are removed to obtain an extremely fine aluminum oxide pattern 28 as shown in FIG. 4C.

Figure 4D:
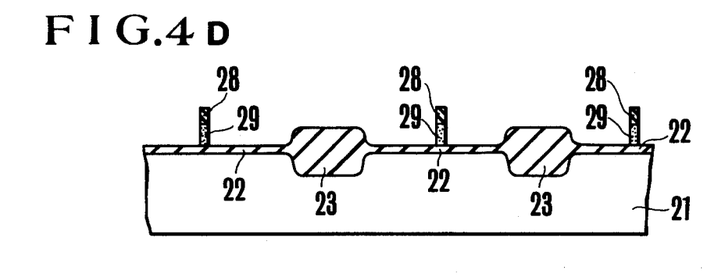

Then, in a $CCl_2F_2$ gas atmosphere at a pressure of 0.1 Torr, the aluminum oxide pattern 28 is used as a mask to remove exposed polycrystalline silicon region with the parallel plate plasma etching process, thus leaving a combination of a polycrystalline silicon regions 29 having an extremely small width on the gate oxide film 22 and aluminum oxide patterns 28 also having an extremely narrow width and mounted on the regions 29, as shown in FIG. 4D.

Figure 4E:
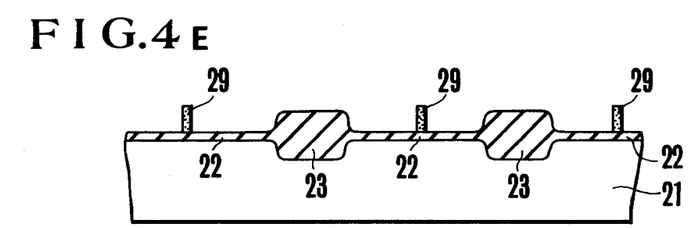

Then, the assembly is immersed in a solution containing phosphoric acid and nitric acid to remove the aluminum oxide pattern 28 leaving only the polycrystalline silicon region 29. This state is shown in FIG. 4E. At this time, since the height of the polycrystalline silicon region 29 can be sufficiently large thereof the region 29 efficiently functions as a stopping member during the subsequent ion implantation process.

Figure 4F:
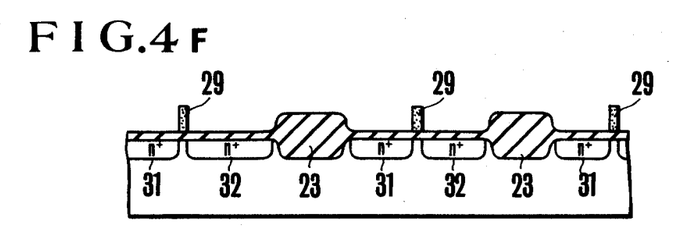

Then, ions of a n type impurity, for example As, are implanted to form adjacent source region 31 and drain region 32 on the main surface of the semiconductor substrate 21. Since these regions are formed by using the polycrystalline region 29 as a mask, a short channel preliminarily determined by the width of the polycrystalline silicon region 29 is formed between the source region 31 and the drain region 32. Further, ion implantation can be performed prior to removing of the aluminum oxide by acid solution.

Figure 5A:
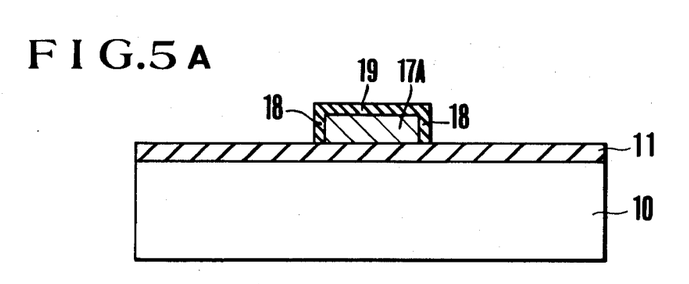
FIGS. 5A and 5B, FIGS. 6A through 6F and FIGS. 7A through 7F show successive steps of the other embodiments of this invention.

FIGS. 5A and 5B show another embodiment of the method of forming a pattern of this invention in which the same substrate as shown in FIG. 1A through 1E is used. FIG. 5A shows a state in which the photoresist layer 16 is removed prior to the oxidation step shown in FIG. 1G, and thereafter the oxidation step is carried out. In this case, the oxidizable region 17A is oxidized, not only at its sidewalls but also its upper surface so that the oxidizable region 17A is surrounded by oxide layer 18 and 19 each having a thickness of 0.02–0.4 micron, for example.

Figure 5B:
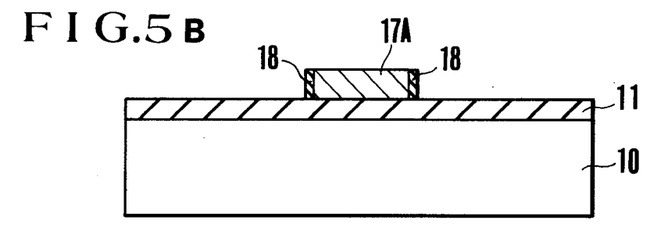

Then, the oxide region 19 on the oxidizable region 17A is removed by the parallel plate plasma etching process utilizing a mixture of $CCl_4$ gas and $H_2$ gas at a pressure of 0.25 Torr and in which a high frequency current of 3 A and 380 KHz was passed. In this case, the portion parallel with the substrate 10 is etched off at a rate of about 280 angstroms/min., whereas vertical side wall portions are not etched off to any appreciable extent. As a result of utilizing the difference in the etching rates, only the oxide regions 18 formed on the sidewalls of the oxidizable region 17A are left as shown in FIG. 5B. Even when $H_2$ gas is not used, a difference in the etching rates is created between portions parallel with the substrate and other portions so that similar result can be obtained.

After following the steps similar to those shown in FIG. 1, the step shown in FIG. 1I is reached.

Figure 6A:
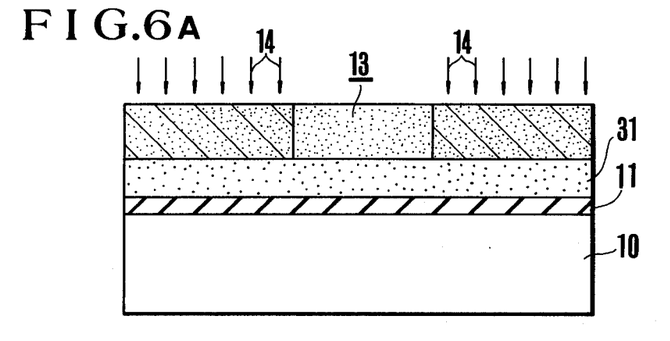
Figure 6B:
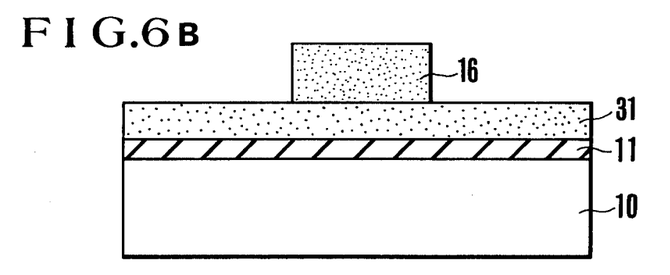

FIGS. 6A through 6F show successive steps of still another embodiment of this invention in which polycrystalline silicon is used as the oxidizable material. The step of forming a silicon dioxide film 11 on a silicon substrate 10 is the same as that shown in FIG. 1A. Thereafter, a polycrystalline silicon layer 31 having a thickness of about 5000 angstroms is formed on the oxide film 11. Then, a photoresist layer 13 having a thickness of 5000 angstroms is formed on the polycrystalline silicon layer 31. Then, the assembly is exposed to light according to a predetermined pattern as shown in FIG. 6A, and exposed portions are removed by development. This state is shown in FIG. 6B.

Figure 6C:
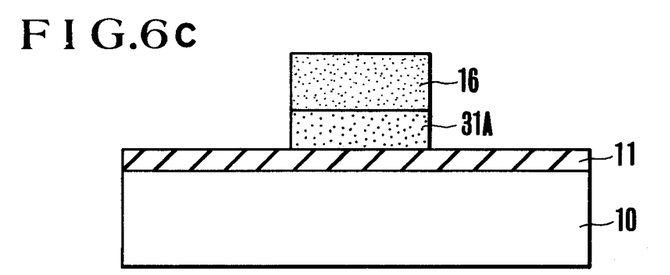

Then, the remaining photoresist region 16 is used as a mask, and the substrate is subjected to the parallel plate plasma etching process in a $CCl_2F_2$ atmosphere at a pressure of 0.1 Torr and in which a high frequency power of 400 W and 13.56 MHz was applied to retain the polycrystalline silicon region 31A beneath the photoresist region 16 but to remove the other portions of the region 31A as shown in FIG. 6C.

Figure 6D:
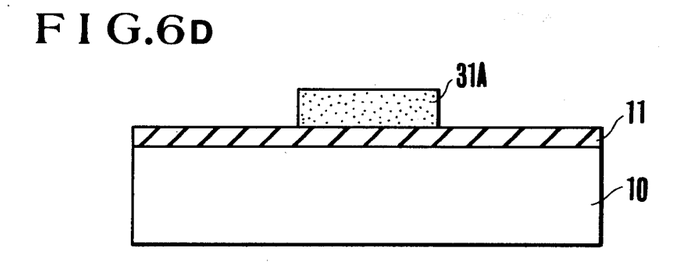

Thereafter, the photoresist region 16 is removed in oxygen plasma with a barrel type plasma reactor process to obtain a structure as shown in FIG. 6D.

Figure 6E:
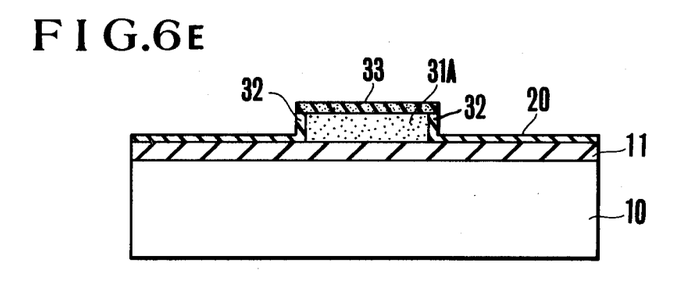

Then, the structure is maintained for 240 minutes in atmosphere consisting of a mixture of $H_2$ gas and $O_2$ gas maintained at temperature of 900° C. to form an oxide layer having a thickness of 0.2 micron on the surface of the polycrystalline silicon region 31A. Of course, an oxide film layer having a thickness of about 0.01 micron is also formed on the other portions of the main surface, that is on the oxide film 11. The oxide layer includes oxide regions 32 covering the substantially vertically side walls of the polycrystalline silicon region, and an oxide region 33 overlying the top surface of the region 31A. This state is shown in FIG. 6E.

Figure 6F:
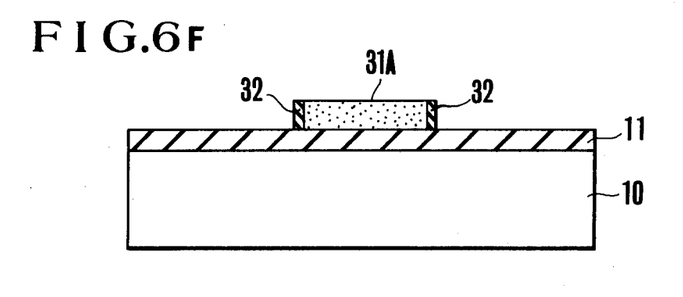

Then, the assembly is subjected to reactive ion etching process in plasma comprising a mixture of $CF_4$ gas and $H_2$ gas to obtain a structure shown in FIG. 6F. Thereafter, the silicon region 31A is etched off with the parallel plate plasma process similar to that used in the step of FIG. 6C in $CCl_2F_2$ gas to obtain a structure similar to that shown in FIG. 1I.

FIGS. 7A through 7F show successive steps of still another embodiment of the method of this invention in which polycrystalline silicon is used as the oxidizable material and silicon nitride $Si_3N_4$ is used as an oxidation preventing mask. At first, a silicon oxide layer 11 having a thickness of 1000 angstroms is formed on a similar substrate 10 having a (100) major surface. Then, the substrate is heated to 650° C. and maintained for about 60 minutes in a gaseous atmosphere consisting of $SiH_4$ (silane) He gas and at a pressure of 0.6 Torr by using low pressure CVD method, whereby a polycrystalline silicon layer having a thickness of about 0.5 micron is formed on the surface of the substrate 10. Thereafter, the substrate is heated to 800° C. and maintained for about 60 minutes in a gas atmosphere consisting of a mixture of He, $SiH_4$ and $NH_3$ at a pressure of 0.7 Torr by using a similar low pressure CVD method to form a silicon nitride layer 35 having a thickness of about 0.1 micron.

Figure 7A:
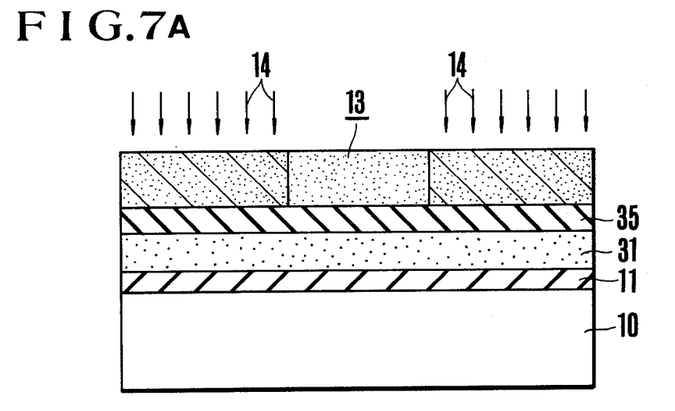

Then, a photoresist layer 13 is formed on the silicon nitride layer 35 which is exposed to ultra violet rays 14 of a predetermined pattern.

Figure 7B:
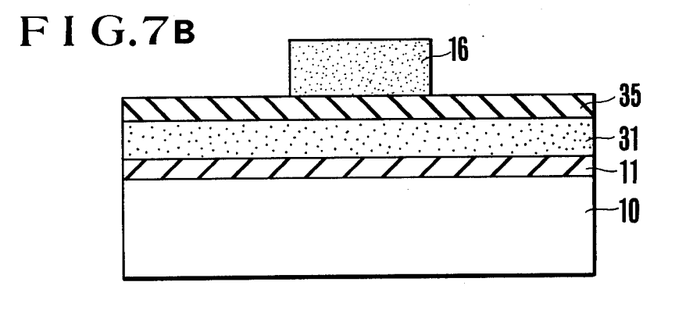
Figure 7C:
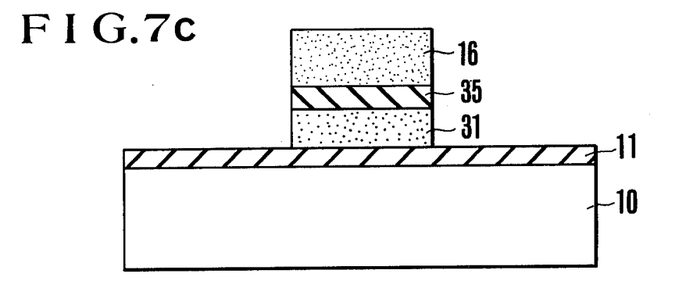
Figure 7D:
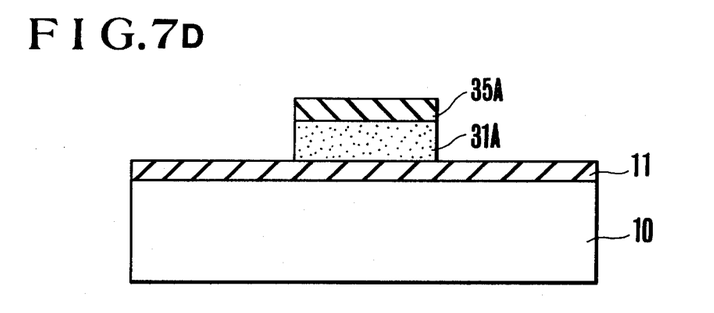
Figure 7E:
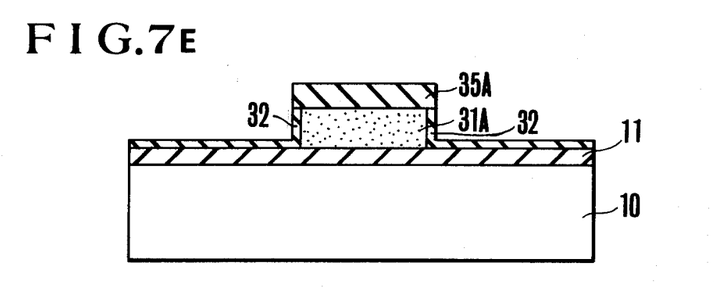

The exposed photoresist is developed and removed to obtain a structure shown in FIG. 7B. The steps shown by FIGS. 7A and 7B are identical to those shown by FIGS. 1D and 1E. Thereafter, the silicon nitride layer 35 and the polycrystalline silicon layer 31 are removed by using the parallel plate plasma etching method in a gas atmosphere of $CCl_2F_2$ at a pressure of 0.1 Torr and by using the remaining photoresist region 16 as a mask in which a high frequency power of 400 W and 13.56 MHz is applied. The resulting state is shown in FIG. 7E.

Then, the photoresist region 16 is removed with oxygen plasma etching method to obtain a structure shown in FIG. 1F. This step corresponds to the step shown in FIG. 1F.

Then the structure is maintained for about 240 minutes in a wet oxygen gas atmosphere maintained at a desired temperature, for example 900° C., to form oxide regions 32 having a thickness of about 0.2 micron on the exposed substantially vertical walls of the polycrystalline silicon region 31A. This state is shown in FIG. 7E.

Figure 7F:
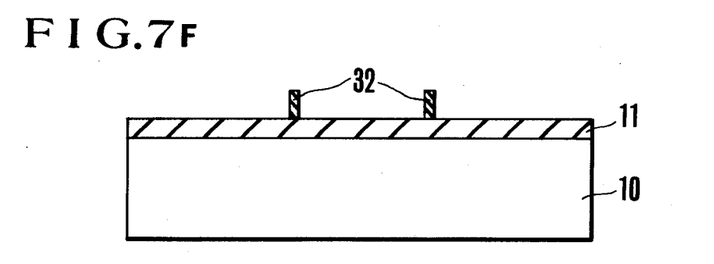

Then, the silicon nitride region 35A and the polycrystalline silicon region 31A are successively removed by using the barrel type plasma reactor in a gas plasma comprising a mixture of $CF_4$ and $O_2$ at a pressure of about 0.4 Torr, thereby obtaining an extremely fine pattern as shown in FIG. 7F.

In the step shown in FIG. 7E, it is also possible to form a silicon island bounded by an oxide region by the steps of removing the silicon nitride region 35A, and then laser annealing the exposed polycrystalline silicon region 31A.

It should be understood that, in this embodiment, amorphous silicon may be used as the oxidizable material instead of polycrystalline silicon.

Figures 8, 9A:
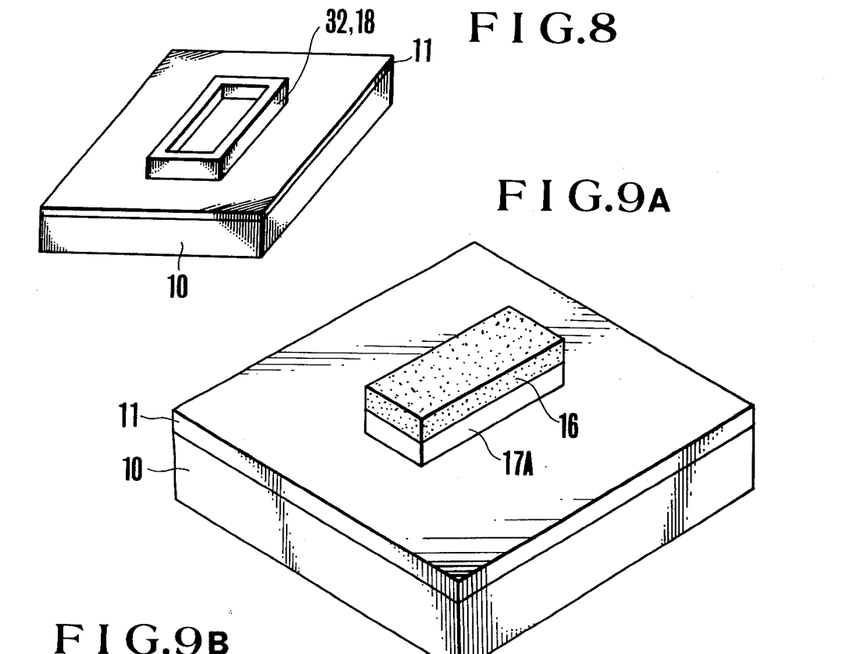
FIG. 8 is a perspective view showing a typical pattern of an oxide region formed by respective embodiments.
FIGS. 9A through 9E show successive steps of still another embodiment of this invention.

Since the oxide region formed by the various methods described above is formed around the sidewalls of the oxidizable region, actually it is a frame shaped pattern as shown in FIG. 8. For this reason, where this pattern is used to form a gate electrode of a MOS FET described in connection with FIG. 4, it is necessary to form parallel patterns in which case a pair of opposing sides is removed by a well known method. According to the type of use of the pattern as a mask, a portion of diagonally opposing corners of the frame shaped pattern may be removed, that is cut away.

FIGS. 9A through 9E show another embodiment of this invention in which parallel oxide regions are formed instead of the frame shaped oxide region shown in FIG. 8.

Figure 9B:
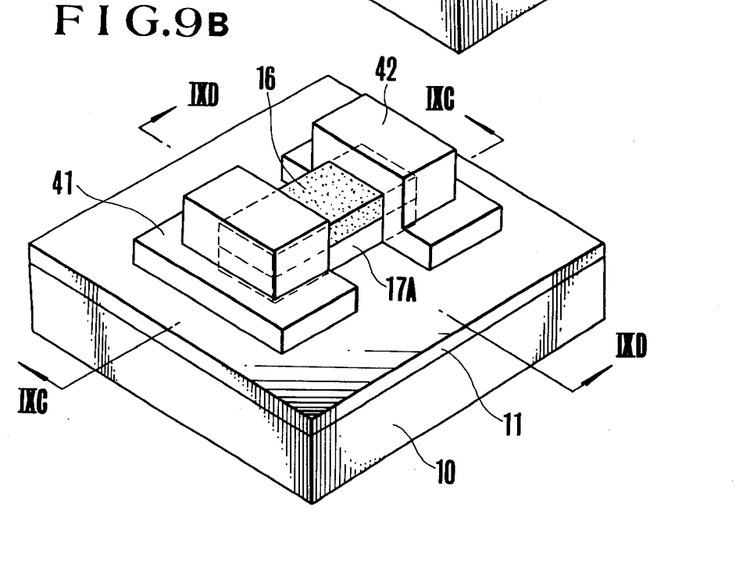
Figure 9C:
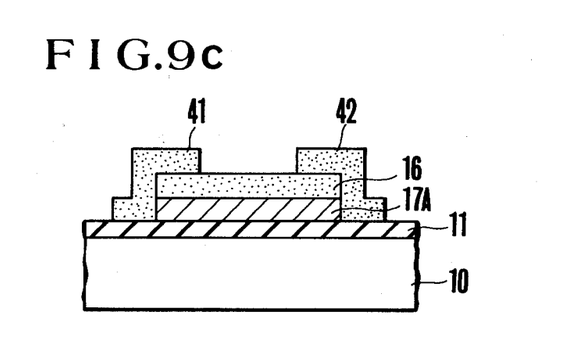
Figure 9D:
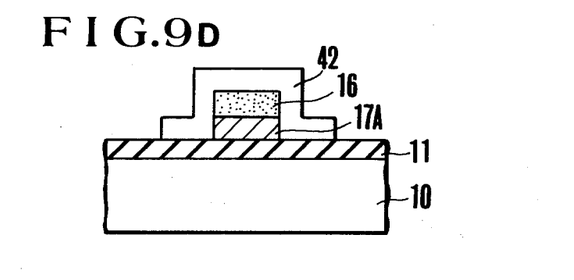

The modification is described by using the steps shown in FIG. 1, and up to the step shown in FIG. 1F, steps identical to those shown in FIG. 1 are used. A perspective view of a structure formed by the step of FIG. 1F is shown in FIG. 9A. More particularly, a rectangular oxidizable region 17A is formed on the oxide layer 11 by using a rectangular photoresist region 16 as a mask. At this time, second photoresist regions 41 and 42 are formed to expose the longitudinal ends of both regions 16 and 17A, the central upper surface and the sidewalls. The longitudinal and cross-sectional configurations of both regions under this state are shown in FIGS. 9C and 9D, respectively. Then, the succeeding oxidation treatment is effective only for exposed sidewalls of the oxidizable region 17A. The oxidization treatment may be the same as that described with reference to FIG. 1G.

Figure 9E:
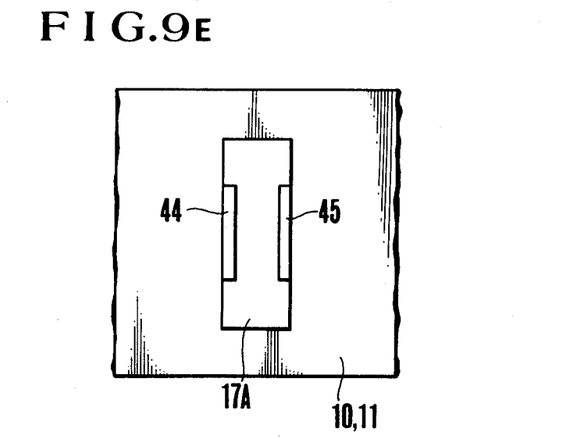

FIG. 9E is a plan view showing that parallel oxide regions 44 and 45 have been formed on both sides of the oxidizable region 17A after removed of the photoresist region 16. The suceeding steps are identical to those shown in FIGS. 1H and 1I.

Where it is desired to form either one of the parallel oxide regions, the portions of the second photoresist on one or both sides of the regions 16 and 17A are removed.

It should be understood that the invention is not limited to the specific embodiments described above and that numerous changes and modifications will be obvious to one skilled in the art.

For example, instead of using aluminum and polycrystalline silicon, any oxidizable material such as Ta, Ti, Mo, Nb etc., may be used. However, it is to be noted that suitable oxidation treatment should be selected for different oxidizable materials. For example, in the case of Ta, Ti and Nb, anodizing or plasma oxidation method is suitable, whereas heat oxidation method is suitable for Mo.

In the embodiments shown in FIGS. 6A and 7A in which ultraviolet rays were irradiated, an electron beam may be used as in the case of FIG. 1. Of course, in such a case, such material as polymethyl metacrylate suitable for electron beam irradiation should be used.

Furthermore, in the foregoing embodiments a positive resist was used as the photoresist and the electron beam resist, it may be substituted by a well known negative resist, if necessary.

It is of course possible to use X-rays instead of an electron beam for forming a resist pattern.

Further, in the illustrated embodiments, for the purpose of patternizing an oxidizable layer plasma etching process utilizing high frequency glow discharge was used, but reactive ion beam etching method, or other dry etching method, or wet etching method utilizing a liquid etchant can also be used.

What is claimed is:

1. A method of manufacturing a MOS FET comprising the steps of:
   forming a gate oxide film and an isolation oxide region on a silicon substrate of one conductivity type;
   forming a polycrystalline silicon layer on said gate oxide film and said element isolation oxide region;
   forming an Al layer on said polycrystalline silicon layer;
   forming a resist pattern of a predetermined shape on said Al layer;
   selectively etching off said Al layer by using said resist pattern as a mask;
   oxidizing the remaining Al layer in warm water;
   removing said resist pattern and remaining Al layer by a dry etching technique utilizing $CCl_4$ thus forming a narrow pattern;
   etching off exposed polycrystalline silicon layer by using said narrow $Al_2O_3$ pattern as a mask thus forming a structure comprising said gate oxide film, said isolation oxide region, a narrow polycrystalline silicon region thereon, and a narrow $Al_2O_3$ pattern;
   dipping said structure in an acid solution to remove said narrow $Al_2O_3$ pattern; and
   implanting an impurity of the other conductivity type into said substrate to form closely adjacent source region and drain region by using said narrow polycrystalline silicon region as a mask.

2. A method of forming a pattern comprising the steps of:
   forming an oxidizable region of a predetermined pattern in a substrate, oxidizing the sidewalls of said oxidizable region and forming an oxidized region surrounding said oxidizable region, forming an oxide layer from said oxidized region, removing said oxidizable region, said oxide layer having a thickness in the range of 0.5 to 0.01 micron, said oxidizable region is made of Al and said oxide region is made of $Al_2O_3$, said oxidizable region of the predetermined pattern formed on said substrate is formed by the steps of forming said oxidizable layer on said substrate, forming a resist layer on said oxidizable layer, shaping said resist layer into a resist region of a predetermined pattern, and etching said oxidizable layer by using said resist region as a mask to shape said oxidizable region to have a predetermined pattern.

3. The method according to claim 2 which further comprises the steps of removing said resist region, oxidizing an upper surface and exposed sidewall of said Al oxidizable region to form oxide regions and etching off the oxide region of the upper surface of said Al oxidizable region.

4. The method according to claim 2 which further comprises a step of forming an insulating layer on said substrate prior to said step of forming said oxidizable region of said predetermined pattern.

5. The method according to claim 2, wherein said oxide region has a rectangular frame shape.

6. The method according to claim 2 which further comprises the steps of forming an oxide region in at least a portion of an exposed sidewall of said oxidizable region, then removing said resist region, and removing a portion of said oxidizable region bounded by said oxide region.

7. The method according to claim 5 wherein a portion of said rectangular frame shaped oxide frame is cut away.

8. The method according to claim 5 wherein at least one corner of said rectangular shaped oxide frame is cut away.

9. A method of patterning device regions by oxidizing patterned aluminum layer comprising the steps of:
   forming an Al layer on a substrate,
   forming a first resist layer on said Al layer,
   shaping said first resist layer into a first resist region of a rectangular figure,
   etching said Al layer into a rectangular Al region by using said first resist region as a mask,
   forming a second resist layer on said first resist region and said rectangular Al region,
   shaping said second resist layer into a second resist region which covers a portion of the sidewall of said rectangular Al region,
   oxidizing the exposed sidewall of said rectangular Al region into an $Al_2O_3$ pattern by immersing said substrate including said rectangular Al region in warm water,
   removing said first and second resist regions, removing remaining Al region by dry etching technique utilizing $CCl_4$.

10. The method according to claim 9 which further comprises a step forming an insulating layer on said substrate prior to said step of forming said Al layer.

* * * * *